United States Patent
Lan et al.

(10) Patent No.: US 12,550,492 B2
(45) Date of Patent: Feb. 10, 2026

(54) FLIP LIGHT EMITTING DIODE CHIP AND MANUFACTURING METHOD THEREFOR

(71) Applicant: HC SEMITEK (ZHEJIANG) CO., LTD., Zhejiang (CN)

(72) Inventors: Ye Lan, Jiangsu (CN); Lei Huang, Jiangsu (CN); Wei Zhang, Jiangsu (CN); Zhihao Wu, Jiangsu (CN); Peng Li, Jiangsu (CN)

(73) Assignee: HC Semitek (Zhejiang) Co. Ltd., Zhejiang (CN)

( * ) Notice: Subject to any disclaimer, the term of this patent is extended or adjusted under 35 U.S.C. 154(b) by 596 days.

(21) Appl. No.: 17/914,749

(22) PCT Filed: Mar. 24, 2021

(86) PCT No.: PCT/CN2021/082608
§ 371 (c)(1),
(2) Date: Sep. 26, 2022

(87) PCT Pub. No.: WO2021/190540
PCT Pub. Date: Sep. 30, 2021

(65) Prior Publication Data
US 2023/0127400 A1     Apr. 27, 2023

(30) Foreign Application Priority Data
Mar. 27, 2020   (CN) .................... 202010227110.7

(51) Int. Cl.
*H10H 20/832* (2025.01)
*H10H 20/01* (2025.01)
*H10H 20/814* (2025.01)

(52) U.S. Cl.
CPC ...... *H10H 20/835* (2025.01); *H10H 20/8142* (2025.01); *H10H 20/032* (2025.01)

(58) Field of Classification Search
CPC ..... H01L 33/382; H01L 33/405; H01L 33/46; H01L 33/60; H01L 33/387; H10H 20/835;
(Continued)

(56) References Cited

U.S. PATENT DOCUMENTS

| 11,437,545 B2 * | 9/2022 | Strozecka-Assig ...... G02B 5/08 |
| 2006/0081869 A1 | 4/2006 | Lu et al. |

(Continued)

FOREIGN PATENT DOCUMENTS

| CN | 104821351 A | 8/2015 |
| CN | 107863434 A | 3/2018 |

(Continued)

OTHER PUBLICATIONS

HC Semitek (Zhejiang) Co Ltd, International Search Report and Written Opinion, PCTCN2021/082608, Jun. 23, 2021, 17 pgs.
(Continued)

*Primary Examiner* — Jessica S Manno
*Assistant Examiner* — Ricky Verdes
(74) *Attorney, Agent, or Firm* — Morgan, Lewis & Bockius LLP

(57) ABSTRACT

This application is directed to a flip light emitting diode chip and a manufacturing method therefor. Said chip comprises a substrate, an N-type semiconductor layer, an active layer, a P-type semiconductor layer, a transparent conductive layer, a transparent insulating layer, a reflective electrode, a connection electrode and DBR layer. The N-type semiconductor layer, active layer and ss P-type semiconductor layer are sequentially stacked on the substrate. The transparent conductive layer and transparent insulating layer are sequentially stacked on the P-type semiconductor layer. A plurality of through holes are provided in the transparent insulating layer, and includes a plurality of rows of first through holes.
(Continued)

The first through holes in the same row have the same distance (d) to a groove provided on the P-type semiconductor layer and in a direction away from the groove. The sum of the cross-sectional areas of the first through holes in each row gradually increases.

20 Claims, 4 Drawing Sheets

(58) Field of Classification Search
  CPC ............. H10H 20/8142; H10H 20/032; H10H 20/841; H10H 20/8312
  See application file for complete search history.

(56) References Cited

U.S. PATENT DOCUMENTS

2013/0277641 A1* 10/2013 Li .................... H10H 20/812
                                                    257/13
2016/0005941 A1* 1/2016 Tsai ................... H10H 20/857
                                                    257/98
2016/0163923 A1* 6/2016 Kuo .................. H10H 20/8162
                                                    257/98

FOREIGN PATENT DOCUMENTS

| | | |
|---|---|---|
| CN | 109786528 A | 5/2019 |
| CN | 110416380 A | 11/2019 |
| CN | 210182405 U | 3/2020 |
| CN | 111446341 A | 7/2020 |
| EP | 3131130 A1 | 2/2017 |

OTHER PUBLICATIONS

HC Semitek (Zhejiang) Co Ltd, International Preliminary Report on Patentability, PCTCN2021/082608, 22SEO2022, 6 pgs.

* cited by examiner

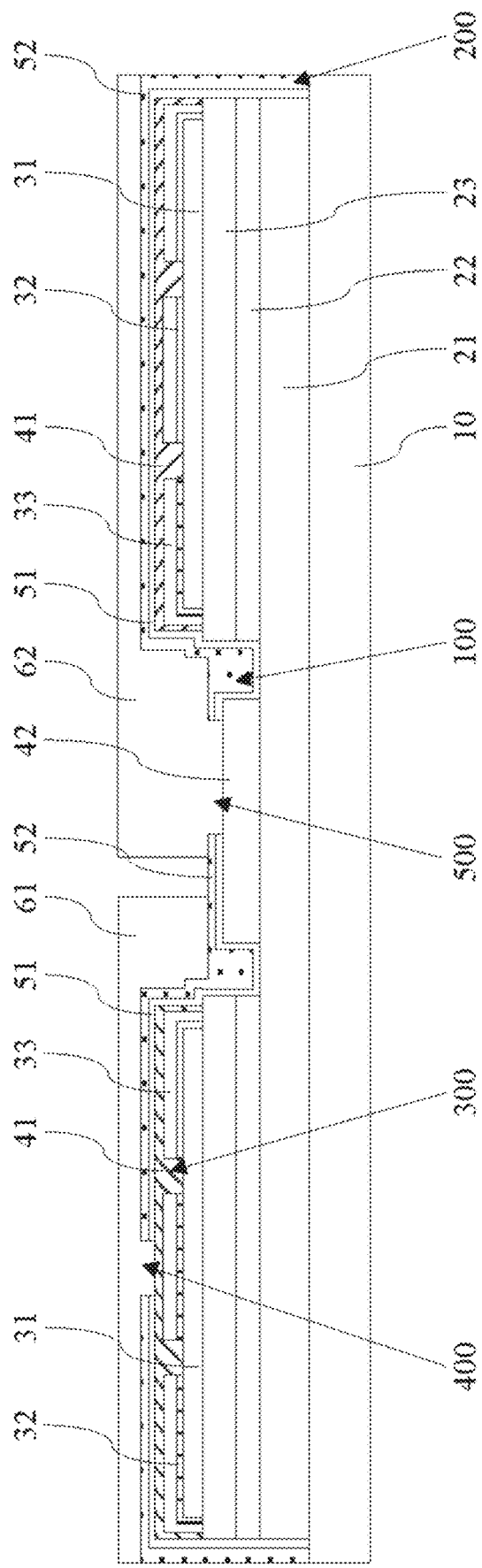
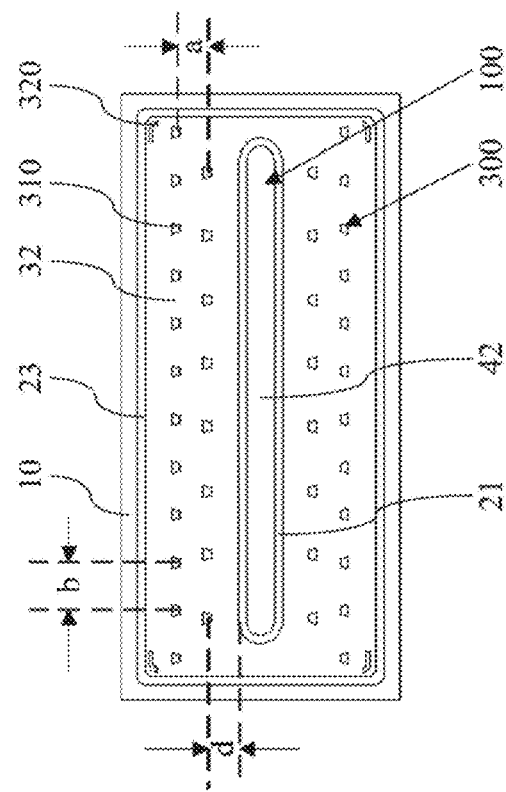
FIG. 1
FIG. 2

FLIP LIGHT EMITTING DIODE CHIP AND MANUFACTURING METHOD THEREFOR

CROSS-REFERENCE TO RELATED APPLICATIONS

This application is a United States National Stage Application filed under 35 U.S.C. § 371 of PCT Patent Application Serial No. PCT/CN2021/082608, filed on Mar. 24, 2021, which claims the benefits of and priority to Chinese Patent Application No. 202010227110.7, filed on Mar. 27, 2020, entitled "Flip Light Emitting Diode Chip And Manufacturing Method Therefor", all of which are incorporated herein by reference in their entirety.

TECHNICAL FIELD

The present disclosure relates to the field of semiconductor technology, and in particular, to a flip light emitting diode chip and a manufacturing method therefor.

BACKGROUND

Light Emitting Diode (LED for short) is a commonly used light emitting device that emits light by energy released by the recombination of electrons and holes, and can convert electricity into light efficiently. The core part of the LED is a chip. LED chips can be classified into face-up LED chips, flip LED chips and vertical LED chips according to their different structures.

In the related art, a flip LED chip includes a substrate, an N-type semiconductor layer, an active layer, a P-type semiconductor layer, a transparent conductive layer, a transparent reflective layer, a reflective electrode and a connection electrode. The N-type semiconductor layer, the active layer and the P-type semiconductor layer are stacked sequentially on the substrate, and the P-type semiconductor layer is provided with a groove extending to the N-type semiconductor layer. The transparent conductive layer, the transparent reflective layer and the reflective electrode are stacked sequentially on the P-type semiconductor layer, the transparent reflective layer is provided with a through hole therein extending to the transparent conductive layer, the reflective electrode is provided in the through hole and in contact with the transparent conductive layer, and is laid on the transparent conductive layer. The connection electrode is provided on the N-type semiconductor layer in the groove.

SUMMARY

Embodiments of the present disclosure provide a flip light emitting diode chip and a manufacturing method therefor. The technical solution is as follows:

At least one embodiment of the present disclosure provides a flip light emitting diode chip, and the a flip light emitting diode chip comprises a substrate, an N-type semiconductor layer, an active layer, a P-type semiconductor layer, a transparent conductive layer, a transparent insulating layer, a reflective electrode, a connection electrode, and a Distributed Bragg Reflection layer.

The N-type semiconductor layer, the active layer and the P-type semiconductor layer are sequentially stacked on the substrate, and the P-type semiconductor layer is provided with a groove extending to the N-type semiconductor layer. The N-type semiconductor layer, the active layer and the P-type semiconductor layer are provide with an isolating groove extending to the substrate. The transparent conductive layer and the transparent insulating layer are sequentially stacked on the P-type semiconductor layer. The transparent insulating layer is provided with a plurality of through holes extending to the transparent conductive layer. The reflective electrode is provided on the transparent insulating layer and in contact with the transparent conductive layer via the plurality of through holes. The connection electrode is provided on the N-type semiconductor layer in the groove. The Distributed Bragg Reflection layer is provided on surfaces of the groove and the isolating groove.

The plurality of through holes comprise a plurality of rows of first through holes, and the first through holes in the same row have the same distance to the groove. In a direction away from the groove, the sum of the cross-sectional areas of the first through holes in each row gradually increases, and the cross section of the first through hole is the section of the first through hole perpendicular to the extending direction of the first through hole.

Optionally, in two adjacent rows of the first through holes, the sum of the cross-sectional areas of the first through holes in the row away from the groove is 120%-140% of the sum of the cross-sectional areas of the first through holes in the row close to the groove.

Optionally, the first through holes in the same row are equal in area, and the plurality of rows of the first through holes satisfy at least one of the following conditions:

in a direction away from the groove, the cross-sectional area of the first through hole gradually increases;

in a direction away from the groove, the number of the first through holes in each row gradually increases.

Optionally, the distance between any two adjacent rows of the first through holes is the same.

Optionally, the distance between two adjacent first through holes in the same row is the same.

Optionally, the first through hole is polygonal.

Optionally, the transparent insulating layer has a cross section shaped as a polygon, and the cross section of the transparent insulating layer is the section of the transparent insulating layer perpendicular to the extending direction of the through hole. The plurality of through holes further comprise a plurality of second through holes, the plurality of second through holes are located at different corners of the polygon.

Optionally, the second through hole has a cross section shaped as a sectored ring. A center of the sectored ring and the corner of the polygon corresponding to the second through hole are located on two sides of the sectored ring. The cross section of the second through hole is the section of the second through hole perpendicular to the extending direction of the second through hole.

Optionally, the sectored ring has a width of 5 microns, and an outer ring diameter of 25 microns.

Optionally, the flip light emitting diode chip further comprises a transparent adhesive layer, and the transparent adhesive layer is sandwiched between the transparent insulating layer and the reflective electrode.

Optionally, the material of the transparent adhesive layer is aluminum oxide.

Optionally, the transparent adhesive layer has a thickness of less than 100 angstroms.

Optionally, the reflective electrode comprises a reflective layer and a blocking layer stacked sequentially, and the blocking layer comprises nickel layers and platinum layers stacked alternately.

Optionally, the reflective layer is a silver layer.

At least one embodiment of the present disclosure provides a manufacturing method for a flip light emitting diode chip, the manufacturing method comprises:

growing an N-type semiconductor layer, an active layer and a P-type semiconductor layer on the substrate sequentially;

forming a groove extending to the N-type semiconductor layer and an isolating groove extending to the substrate in the P-type semiconductor layer;

forming a transparent conductive layer and a transparent insulating layer on the P-type semiconductor layer sequentially;

forming through holes extending to the transparent conductive layer in the transparent insulating layer, wherein a plurality of the through holes comprises a plurality of rows of first through holes, and the first through holes in the same row have the same distance to the groove; in a direction away from the of groove, the sum of the cross-sectional areas of the first through holes in each row gradually increases, and the cross section of the first through hole is the section of the first through hole perpendicular to the extending direction of the first through hole;

forming a reflective electrode on the transparent insulating layer, and the reflective electrode being in contact with the transparent conductive layer via the through holes;

forming a connection electrode on the N-type semiconductor layer in the groove;

forming a Distributed Bragg Reflection layer on surfaces of the groove and the isolating groove.

Optionally, the manufacturing method further comprises:

forming a transparent adhesive layer on the transparent insulating layer before forming the through holes extending to the transparent conductive layer in the transparent insulating layer.

Optionally, the material of the transparent adhesive layer is aluminum oxide.

BRIEF DESCRIPTION OF THE DRAWINGS

FIG. 1 is a schematic structural diagram of a flip light emitting diode chip provided by an embodiment of the present disclosure;

FIG. 2 is a schematic distribution diagram of through holes provided by an embodiment of the present disclosure;

DETAILED DESCRIPTIONS

Figure 3:
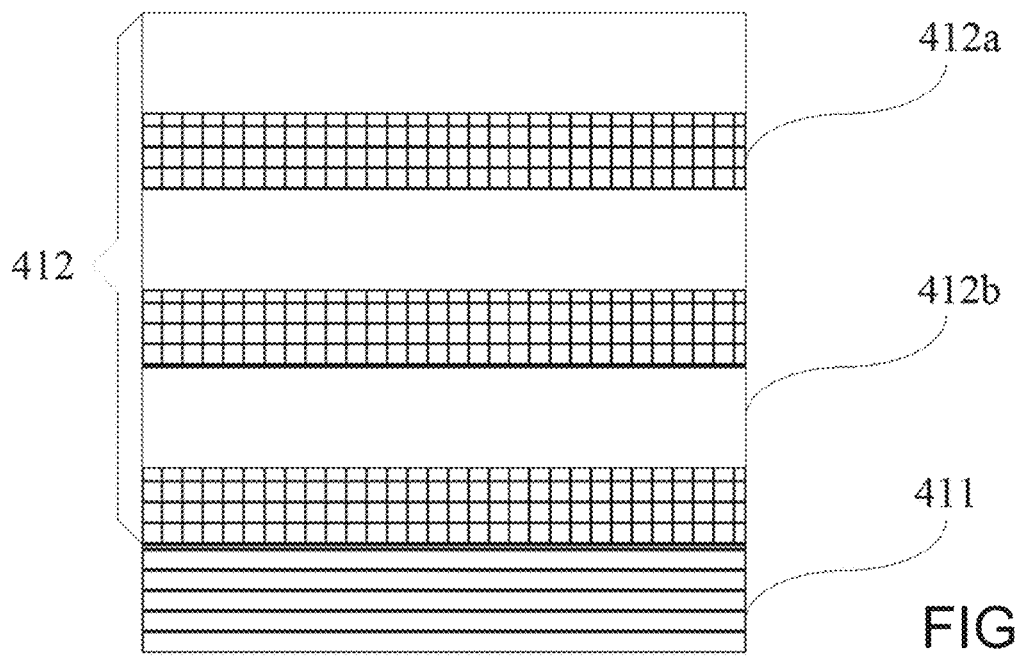
FIG. 3 is a schematic structural diagram of a reflective electrode provided by an embodiment of the present disclosure.

To make the objectives, technical solutions and advantages of the present disclosure clearer, the following further describes the embodiments of the present disclosure in detail with reference to the accompanying drawings.

In an LED chip, electrons and holes are combined to emit light in an active layer, thus, the active layer is also a light emitting layer, and the light emitted from the light emitting layer will be emitted out uniformly in all directions. For the flip LED chip, the final output of the LED chip is the light rays emitted from the substrate. If the light rays emitted from the P-type semiconductor layer is reflected, the propagation direction of the light rays will be changed, and the light rays emitted from the substrate will increase, thus the light emitting brightness of the flip LED chip may be improved.

In the related art, the transparent conductive layer, the transparent reflective layer and the reflective electrode are stacked sequentially on the P-type semiconductor layer, only the light rays emitted from the P-type semiconductor layer can be reflected, the light rays emitted toward the sides of the flip LED chip (the surfaces of the flip LED chip parallel to a stacking direction of the N-type semiconductor layer, the active layer, and the P-type semiconductor layer) are emitted out directly from the flip LED chip, and are not effectively used. The transparent reflective layer is made of transparent insulating material, the effect thereof being to improve the reflection effect of the reflective electrode. The reflective electrode is usually a metal electrode, such as a silver electrode.

The transparent reflective layer is made to extend from the P-type semiconductor layer to the sides of the flip LED chip, that is, the transparent reflective layer is laid on surfaces of a groove and an isolating groove extending from the P-type semiconductor layer to the substrate, in this way, the light rays emitted from the sides of the flip LED chip can be reflected, enabling this portion of light rays to be emitted from the substrate, the way of which finally improves the light emitting brightness of the flip LED chip. In the above related art, the isolating groove is a groove used for chip cutting.

In the related art, the transparent reflective layer is provided with through holes therein extending to the transparent conductive layer. A reflective electrode is provided in the through hole and in contact with the transparent conductive layer, and is laid on the transparent reflective layer. A connection electrode is provided on the N-type semiconductor layer in the groove. However, if both the reflective electrode and the transparent reflective layer extend to surfaces of the flip LED chip, for example, to the groove where the connection electrode is located, the reflective electrode may contact with the connection electrode such that a short circuit will occur. Therefore, while the transparent reflective layer is made to extend from the P-type semiconductor layer to the sides of the flip LED chip, the order of stacking the transparent reflective layer and the reflective electrode is interchanged, that is, first the reflective electrode is laid on the transparent conductive layer (not extending into the groove), and then a transparent reflective layer is laid on the reflective electrode (extending into the groove and to two sides of the LED chip), ensuring that the reflective electrode is located outside the groove and is spaced apart from the connection electrode in the groove.

After the reflective electrode is directly laid on the transparent conductive layer, the current from the reflective electrode can be injected into the P-type semiconductor layer from the entire contact surface through the transparent conductive layer. The current from the reflective electrode, after injected into the P-type semiconductor layer, first flows in a direction parallel to the side of the flip LED chip and reaches the N-type semiconductor layer, then flows in a direction perpendicular to the side of the flip LED chip and reaches the connection electrode in the groove. The resistance experienced by the current which is injected by the reflective electrode at a region close to the groove and reaches the connection electrode is smaller than the resistance experienced by the current which is injected by the reflective electrode at a region far from the groove and reaches the connection electrode. The current from the reflective electrode tends to be injected in the P-type semiconductor layer from the region close to the groove. The current injected in the P-type semiconductor layer from regions of the reflective electrode is not uniform, and the active layer does not emit light sufficiently, which finally affects the light emitting brightness of the flip LED chip.

Based on the foregoing, an embodiment of the present disclosure provides a flip light emitting diode chip. FIG. 1 is a schematic structural diagram of a flip light emitting diode chip provided by an embodiment of the present disclosure. Referring to FIG. 1, the flip LED chip includes a substrate 10, an N-type semiconductor layer 21, an active layer 22, a P-type semiconductor layer 23, a transparent conductive layer 31, a transparent insulating layer 32, a reflective electrode 41, a connection electrode 42 and a Distributed Bragg Reflection (DBR for short) layer 51.

In an embodiment of the present disclosure, as shown in FIG. 1, the N-type semiconductor layer 21, the active layer 22 and the P-type semiconductor layer 23 are stacked sequentially on the substrate 10, and the P-type semiconductor layer 23 is provided with a groove 100 therein extending to the N-type semiconductor layer 21 and an isolation groove 200 therein extending to the substrate 10. The transparent conductive layer 31 and the transparent insulating layer 32 are stacked sequentially on the P-type semiconductor layer 23. The transparent insulating layer 32 is provided with a plurality of through holes 300 therein extending to the transparent conductive layer 31. The reflective electrode 41 is laid on the transparent insulating layer 32 and in contact with the transparent conductive layer 31 via the plurality of through holes 300. The connection electrode 42 is provided on the N-type semiconductor layer 21 in the groove 100. The DBR layer 51 is laid on surfaces of the groove 100 and the isolating groove 200.

FIG. 2 is a schematic distribution diagram of the through holes according to an embodiment of the present disclosure. Referring to FIG. 2, the plurality of through holes 300 include a plurality of rows of first through holes 310, and the first through holes 310 in the same row have the same distance d to the groove 100. In a direction away from the of groove 100, the sum of the cross-sectional areas of the first through holes 310 in each row gradually increases, and the cross section of the first through holes 310 is the section of the first through hole 310 perpendicular to an extending direction of the first through hole 310.

In an embodiment of the present disclosure, as shown in FIG. 2, the distance d between the first through hole 310 and the groove 100 is the shortest distance between a center of the first through hole 310 and an edge of the groove 100.

The embodiment of the present disclosure allows the region where the reflective electrode injects current into the transparent conductive layer to be affected by the distribution of the plurality of through holes by adding the transparent insulating layer between the transparent conductive layer and the reflective electrode, forming the plurality of through holes extending to the transparent conductive layer in the transparent insulating layer, and making the reflective electrode contact with the transparent conductive layer via the plurality of through holes. The plurality of through holes are divided into rows according to far and near of the distance from the groove, and the sum of the cross-sectional areas of the through holes in each row gradually increases in a direction away from the groove, that is, in two adjacent rows of through holes, the sum of the cross-sectional areas of the through holes in a row close to the groove is smaller, and the current that the reflective electrode may inject is less, while the sum of the cross-sectional areas of the through holes in a row away from the groove is larger, and the current that the reflective electrode may inject is more. The current from the reflective electrode can be directed to inject into the transparent conductive layer from the region far from the groove, which is opposite to the effect of the current from the reflective electrode being directed to inject into the transparent conductive layer from the region close to the groove due to the resistance difference caused by far and near of the distance from the connection electrode. The combined effect of the two can make the reflective electrode uniformly inject current into various regions of the P-type semiconductor layer, increasing the uniformity of current injection into the transparent conductive layer, and enabling the active layer to emit light sufficiently, thus finally improving the light emitting brightness of the flip LED chip.

Moreover, there is almost no loss of light in the transparent insulating layer, and the transparent insulating layer will have no negative impact on the light emitting brightness of the flip LED chip. The DBR layer is laid on surfaces of the groove and the isolating groove, which enables to reflect the light rays emitted toward the sides of the flip LED chip, and accordingly increases the light rays emitted from the substrate, and the light emitting brightness of the flip LED chip is improved. The reflective electrode is located on the P-type semiconductor layer outside the groove, and the connection electrode is located on the N-type semiconductor layer in the groove, thus there is no circuit short between the two because of no contact.

In addition, the distribution of the plurality of through holes is similar to the condition that the film layer is added with roughening particles on the surface thereof, which has a refraction effect on the light rays, and can change the direction of the light rays, making the direction of some of the light rays fall into the range of reflection, such that the light rays emitted from the substrate are increased, and finally the light emitting brightness of the flip LED chip is improved.

In the embodiment of the present disclosure, as shown in FIG. 1, the first through hole 310 can be a column, and the cross-sectional area of the first through hole 310 remains unchanged in the extending direction of the first through hole 310. The depth of the first through hole 310 is equal to the thickness of transparent insulating layer 32.

Illustratively, as shown in FIG. 2, the cross section of the first through hole 310 is a polygonal shape, such as a quadrilateral, a hexagon, or a polygon with other number of sides, and the cross-sectional area of the first through hole 310 is the area of the polygonal shape.

Illustratively, a side length of the polygonal shape may be 10 microns to 14 microns.

Optionally, in two adjacent rows of first through holes 310, the sum of the cross-sectional areas of the first through holes 310 in the row away from the groove 100 may be 120%~140% of the sum of the cross-sectional areas of the first through holes 310 in the row close to the groove 100. By controlling the magnitude of the difference between the sums of the cross-sectional areas of the first through holes 310 in each row, the reflective electrode could be made to inject the current uniformly into each region of the P-type semiconductor layer.

Illustratively, in two adjacent rows of the first through holes 310, the sum of the cross-sectional areas of the first through holes 310 in the row away from the groove 100 is 130% of the sum of the cross-sectional areas of the first through holes 310 in the row close to the groove 100, which provides sound result in practical applications.

In a first implementation of the embodiment of the present disclosure, the number of the first through holes 310 in each row is equal, and the first through holes 310 in the same row are equal in area. In a direction away from the groove 100, the cross-sectional area of the through hole 310 in the different row gradually increases.

Illustratively, in two adjacent rows of the first through holes 310, the cross-sectional area of the first through hole 310 in the row close to the groove 100 is S, the cross-sectional area of the first through hole 310 in the row away from the groove 100 is S*130%, and the number of the first through holes 310 in each of the two rows is N. At this time, the sum of the cross-sectional areas of the first through holes 310 in the row close to the groove 100 is N*S, and the sum of the cross-sectional areas of the first through holes 310 in the row away from the groove 100 is 130%*N* S.

In a second implementation of the embodiment of the present disclosure, the first through holes 310 are equal in cross-sectional area, and in a direction away from the groove 100, the number of the first through holes 310 in each row gradually increases.

Illustratively, in two adjacent rows of the first through holes 310, the number of the first through holes 310 in the row close to the groove 100 is N, and the number of the first through holes 310 in the row away from the groove 100 is N *130%, the cross-sectional area of each first through hole 310 in two rows is S. At this time, the sum of the cross-sectional areas of the first through holes 310 in the row close to the groove 100 is N*S, and the sum of the cross-sectional areas of the first through holes 310 in the row away from the groove 100 is 130%*N* S.

In a third implementation of the embodiment of the present disclosure, the first through holes 310 in the same row are equal in cross-sectional area, and in a direction away from the groove 100, the cross-sectional area of the first through hole 310 in the different row gradually increases, the number of the first through holes 310 in each row gradually increases.

Illustratively, the plurality of through holes 300 may comprise two rows of first through holes 310, the cross-sectional area of the first through hole 310 in the row close to the groove 100 is S, and the cross-sectional areas of the first through hole 310 in the row away from the groove 100 is S*120%; the number of the first through holes 310 in the row close to the groove 100 is N, and the number of the first through holes 310 in the row away from the groove 100 is N*110%. At this time, the sum of the cross-sectional areas of the first through holes 310 in the row close to the groove 100 is N*S, and the sum of the cross-sectional areas of the first through holes 310 in the row away from the groove 100 is 132%*N* S.

In the first and second implementation of the embodiment of the present disclosure, the number of the first through holes 310 in each row or the cross-sectional area of each first through hole 310 is equal, which facilitates implementation. In the third implementation of the embodiment of the present disclosure, the number of the first through holes 310 in each row and the cross-sectional area of each first through hole 310 are changed at the same time, which enables an evident effect after implementation.

In view of the above, the plurality of rows of the first through holes 310 can satisfy at least one of the following conditions, which help to achieve that the sum of the cross-sectional areas of the first through holes 310 in each row gradually increases in a direction away from the groove 100:

in a direction away from the groove 100, the cross-sectional area of each of the first through holes 310 gradually increases.

in a direction away from the groove 100, the number of the first through holes 310 in each row gradually increases.

Optionally, as shown in FIG. 2 , the distance a between the first through holes 310 in any two adjacent rows may be equal, which facilitates the current from the reflective electrode to be uniformly injected into each region of the P-type semiconductor layer.

In the embodiment of the present disclosure, as shown in FIG. 2, the distance a between the first through holes 310 in two adjacent rows is the difference between the distances respectively between the first through holes 310 in the two adjacent rows and the groove 100.

Optionally, as shown in FIG. 2, the distance b between two adjacent first through holes 310 in the same row may be equal, which facilitates the current of the reflective electrode to be uniformly injected into each region of the P-type semiconductor layer.

In the embodiment of the present disclosure, as shown in FIG. 2, the distance b between two adjacent first through holes 310 in the same row is the distance between the centers of two adjacent first through holes 310 in the same row.

Optionally, as shown in FIG. 2, the transparent insulating layer 32 has a cross section shaped as a polygon, and the cross section of the transparent insulating layer 32 is the section of the transparent insulating layer 32 perpendicular to the extending direction of the through hole 300. The plurality of through holes 300 may further include a plurality of second through holes 320, and the plurality of second through holes 320 are located at different corners of the polygon.

In practical applications, as shown in FIG. 2, the groove 100 is provided at the center of the cross section of the transparent insulating layer 32, which facilitates the spread of the current. At this time, the corner of the polygon is the position with the farthest distance from the groove 100, where the current from the reflective electrode is least prone to be injected. The second through holes 320 are respectively provided at corners of the polygon, which facilitates the current from the reflective electrode to be injected into the P-type semiconductor layer 23 from these positions, and accordingly assists in fully utilizing the active layer 22 to emit light.

Illustratively, as shown in FIG. 2, the cross section of the transparent insulating layer 32 is a rectangle, and four second through holes 320 are respectively provided at four corners of the rectangle.

Optionally, as shown in FIG. 2, the second through hole 320 may have a cross-section shaped as a sectored ring, the center of the sectored ring and the corner of the polygon corresponding to the second through-hole 320 are provided on two sides of the sectored ring The cross section of the second through hole 320 is the section of the second through hole 320 perpendicular to an extending direction of the second through hole 320, and the extending direction of the second through hole 320 is the thickness direction of the transparent insulating layer 32.

The cross section of the second through hole 320 is the sectored ring, the center of the sectored ring and the corner of the polygon are provided on two sides of the sectored ring, and the second through hole 320 is provided at a position closest to the corner of the polygon, which facilitate the current from the reflective electrode to be injected into a position where the distance between the P-type semiconductor layer 23 and the groove 100 is the farthest, and assists in fully utilizing the active layer 22 to emit light.

Illustratively, the sectored ring may has a width of 5 microns, and an outer ring diameter of 25 microns.

In the embodiment of the present disclosure, the material of the substrate 10 may be sapphire, the material of the N-type semiconductor layer 21 may be N-type doped GaN. The active layer 22 may include InGaN layers and GaN layers stacked alternately. The material of the P-type semiconductor layer 23 may be P-type doped GaN.

Optionally, the flip LED chip can further include a buffer layer, the material of the buffer layer is AlN, and the buffer layer can be sandwiched between the substrate 10 and the N-type semiconductor layer 21 to relieve lattice mismatch between the substrate 10 and the N-type semiconductor layer 21.

In the embodiment of the present disclosure, the material of the transparent conductive layer 31 may be indium tin oxide (ITO for short).

Illustratively, the thickness of the transparent conductive layer 31 may be 400 angstroms to 600 angstroms, such as 500 angstroms.

Optionally, the refractive index of the transparent insulating layer 32 may be smaller than that of the transparent conductive layer 31.

In the condition of the refractive index of the transparent insulating layer 32 being smaller than that of the transparent conductive layer 31, total reflection is more likely to occur when the light rays from the transparent conductive layer 31 are emitted to the transparent insulating layer 32, which reduces the proportion of light rays reaching the reflective electrode and avoids part of the light rays being absorbed by the reflective electrode 41 when the light rays reaches the reflective electrode 41 through the transparent insulating layer 32, thus the light rays lost by the reflective electrode 41 are reduced, and accordingly the light emitting brightness of the flip LED chip is improved.

Illustratively, the material of the transparent insulating layer 32 may be silicon oxide.

The refractive index of silicon oxide is as low as 1.46, and the material of the transparent insulating layer 32 is silicon oxide, such that a total reflection angle on the boundary surface between the transparent insulating layer 32 and the transparent conductive layer 31 is small. Accordingly, there is a high possibility that the light rays emitted from the transparent conductive layer 31 to the transparent insulating layer 32 are totally reflected, thus the light rays lost by the reflective electrode 41 can be reduced as much as possible, and accordingly the light emitting brightness of the flip LED chip is improved.

Illustratively, the thickness of the transparent insulating layer 32 may be 1800 angstroms to 2200 angstroms, such as 2000 angstroms, which can effectively achieve electrical insulation between the reflective electrode 41 and the transparent conductive layer 31 on two sides of the transparent insulating layer 32, and direct the current from the reflective electrode 41 to be injected into the transparent conductive layer 31 in contact with the reflective electrode 41.

Optionally, as shown in FIG. 1, the flip light emitting diode chip may further include a transparent adhesive layer 33, the material of the transparent adhesive layer 33 is aluminum oxide, and the transparent adhesive layer 33 is sandwiched between the transparent insulating layer 32 and the reflective electrode 41.

In practical applications, the reflective electrode 41 includes a silver layer, which has the best reflection effect. The adhesion between aluminum oxide and silver is better than that between silicon oxide and silver. Both aluminum oxide and silicon oxide are oxides, and the adhesion between them is also relatively good. Therefore, the solution that the transparent adhesive layer made of aluminum oxide is added between the transparent insulating layer 32 made of silicon oxide and the reflective electrode 41 made of silver facilitates to enhance the adhesion between the transparent insulating layer 32 and the reflective electrode 41 and avoids the detaching of the reflective electrode 41 from the transparent insulating layer 32, thereby improving the stability of the flip LED chip. In addition, the chemical bonds of aluminum oxide are very stable, accordingly protecting silver from oxidation.

Alternatively, a thickness of the transparent adhesive layer 33 may be less than 100 angstroms.

Illustratively, the thickness of the transparent adhesive layer 33 may be 40 angstroms to 60 angstroms, such as 50 angstroms.

The thickness of the transparent adhesive layer 33 is controlled within a certain range, thereby not only improving the adhesion between the transparent insulating layer 32 and the reflective electrode 41 but also avoiding the loss of light.

FIG. 3 is a schematic structural diagram of a reflective electrode provided by an embodiment of the present disclosure. Referring to FIG. 3, the reflective electrode 41 may include a reflective layer 411 and a blocking layer 412 stacked sequentially. The reflective layer 411 is a silver layer. The blocking layer 412 includes nickel layers 412a and platinum layers 412b stacked alternately.

The nickel layer 412a has a high density, and the platinum layer 412b can relieve the impact force, thus the blocking layer 412 formed by alternately stacking the nickel layers 412a and the platinum layers 412b can effectively isolate the silver layer from external corrosives, and accordingly allow for the effective protection to the silver layer.

Illustratively, the number of alternating periods of nickel layers 412a and platinum layers 412b in the blocking layer 412 may be 3, that is, the blocking layer 412 is composed of three nickel layers 412a and three platinum layers 412b stacked alternately. In the case of effectively protecting the silver layer, the number of the alternating periods of the nickel layers 412a and the platinum layers 412b should be reduced as much as possible to save implementation cost.

Illustratively, the thickness of the silver layer may be 3000 angstroms. The thickness of the nickel layer 412a may be 1300 angstroms to 1700 angstroms, such as 1500 angstroms. The thickness of the platinum layer 412b may be 2500 angstroms to 3500 angstroms, such as 3000 angstroms.

In an embodiment of the present disclosure, the connection electrode 42 may include a first chromium layer, an aluminum layer, a second chromium layer, a titanium layer, and a gold layer that are stacked sequentially.

Illustratively, the thickness of the first chromium layer may be 50 angstroms, the thickness of the aluminum layer may be 5000 angstroms, the thickness of the second chromium layer may be 1000 angstroms, the thickness of the titanium layer may be 500 angstroms, and the thickness of the gold layer may be 2000 angstroms.

In an embodiment of the present disclosure, the DBR layer 51 may include silicon oxide layers and titanium oxide layers stacked alternately.

Illustratively, the number of periods of the silicon dioxide layers and the titanium oxide layers may be 32.

Optionally, as shown in FIG. 1, the flip LED chip may further include a passivation layer 52, and the material of the passivation layer 52 is silicon nitride. The passivation layer 52 is laid on the DBR layer 51. The hardness of silicon nitride is relatively high and accordingly allow for the effective protection to the flip LED chip.

For example, the thickness of the passivation layer 52 may be 1 micron.

In practical applications, as shown in FIG. 1, the DBR layer 51 and the passivation layer 52 are laid on all surfaces of the flip LED chip other than the surfaces of the substrate 10 so as to allow for a comprehensive protection to the flip LED chip. The DBR layer 51 and the passivation layer 52 are respectively provided with a P-type communication hole(s) 400 extending to the reflective electrode 41 and an N-type communication hole(s) 500 extending to the connection electrode 42 so as to realize current injection.

Illustratively, the number of both P-type communication holes 400 and N-type communication holes 500 may be plural.

Figure 4:
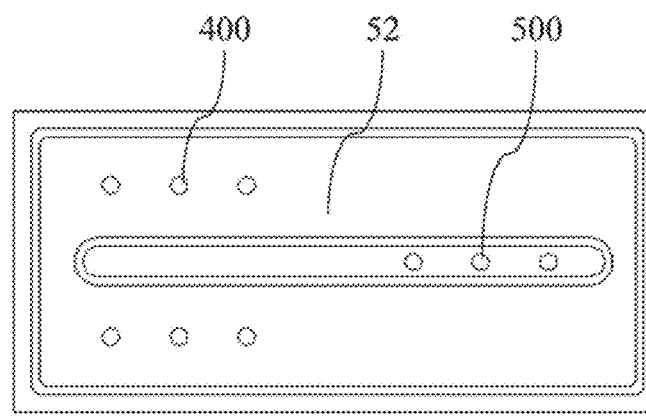
FIG. 4 is a schematic distribution diagram of P-type communication holes and N-type communication holes provided by an embodiment of the present disclosure.

FIG. 4 is a schematic distribution diagram of P-type communication holes and N-type communication holes according to an embodiment of the present disclosure. Referring to FIG. 4, a plurality of P-type communication holes 400 are provided in the edge region of the passivation layer 52, and a plurality of N-type communication holes 500 are provided in the central region of the passivation layer 52.

The plurality of P-type communication holes 400 are provided in the edge region of the passivation layer 52, which is corresponding to the setting region of the reflective electrode 41. The plurality of P-type communication holes 400 may be column-shaped through holes to facilitate opening. The plurality of N-type communication holes 500 are provided in the central region of the passivation layer 52, which is corresponding to the setting region of the connection electrode 42. The plurality of N-type communication holes 500 may be column-shaped through holes to facilitate opening. The plurality of P-type communication holes 400 are provided on one side of the passivation layer 52, as shown on the left side of FIG. 4, and the plurality of N-type communication holes 500 are provided on the other side of the passivation layer 52, as shown on the right side in FIG. 4, which can effectively avoid the connection between the reflective electrode 41 and the connection electrode 42, and accordingly a short circuit will not occur.

Illustratively, the number of the P-type communication holes 400 may be 6, and the number of the N-type communication holes 500 may be 3, which makes insulation and processing as convenient as possible on the premise of ensuring the effect of current injection.

Optionally, as shown in FIG. 1, the flip LED chip may further include a P-type pad 61 and an N-type pad 62. The P-type pad 61 overlays the passivation layer 52 around the P-type communication holes 400, and contacts with the reflective electrode 41 via the P-type communication hole 400; the N-type pad 62 overlays the passivation layer 52 around the N-type communication holes 500, and contacts with the connection electrode 42 via the N-type communication hole 500, the way of which facilitates to fix the flip LED chip on a circuit board and form an electrical connection.

Figure 5:
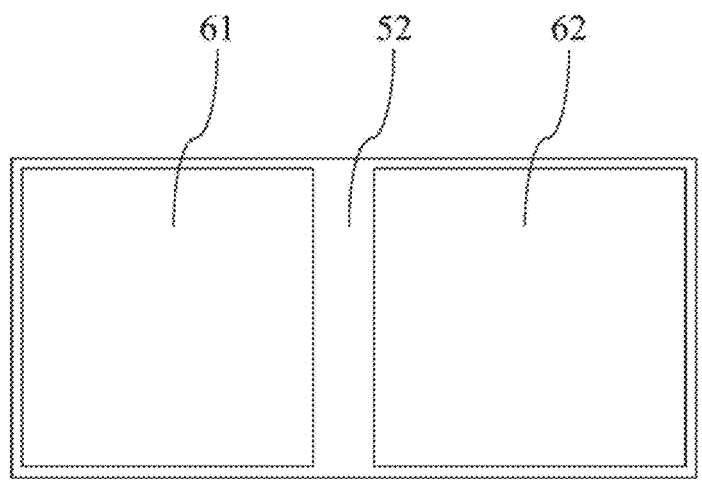
FIG. 5 is a schematic distribution diagram of a P-type pad and an N-type pad provided by an embodiment of the present disclosure.

FIG. 5 is a schematic distribution diagram of a P-type pad and an N-type pad according to an embodiment of the present disclosure. Referring to FIG. 5, the P-type pad 61 and the N-type pad 62 are provided on the passivation layer 52 at intervals, and are insulated from each other, the setting regions of the P-type pad 61 and the N-type pad 62 on the passivation layer 52 are the same in size, which facilitates to form stable electrical connection with the circuit board.

In an implementation of the embodiment of the present disclosure, the P-type pad 61 and the N-type pad 62 may include a first nickel layer, a first aluminum layer, a second nickel layer, a second aluminum layer, a third nickel layer, a third aluminum layer, and a gold layer that are stacked sequentially.

In another implementation of the embodiment of the present disclosure, the P-type pad 61 and the N-type pad 62 may include a first titanium layer, a first aluminum layer, a second titanium layer, a second aluminum layer, a third titanium layer, a third aluminum layer, a fourth titanium layer, a nickel layer, and a gold layer that are stacked sequentially.

The gold layer has high flexibility, which can effectively alleviate the damage to the flip LED chip caused by the force during a welding process. The aluminum layer also has some flexibility, and can cooperate with the gold layer to alleviate the damage to the flip LED chip caused by the force during the welding process. The associated use of the gold layer and the aluminum layer has a lower implementation cost than the total use of the gold layers. In addition, the aluminum layer has a relatively good reflectivity, which facilitates improving the light emitting brightness of the flip LED chip. The nickel layers and the titanium layers have a relatively high density, and are stacked with the aluminum layers alternately, which facilitates shaping of the aluminum layers.

Figure 6:
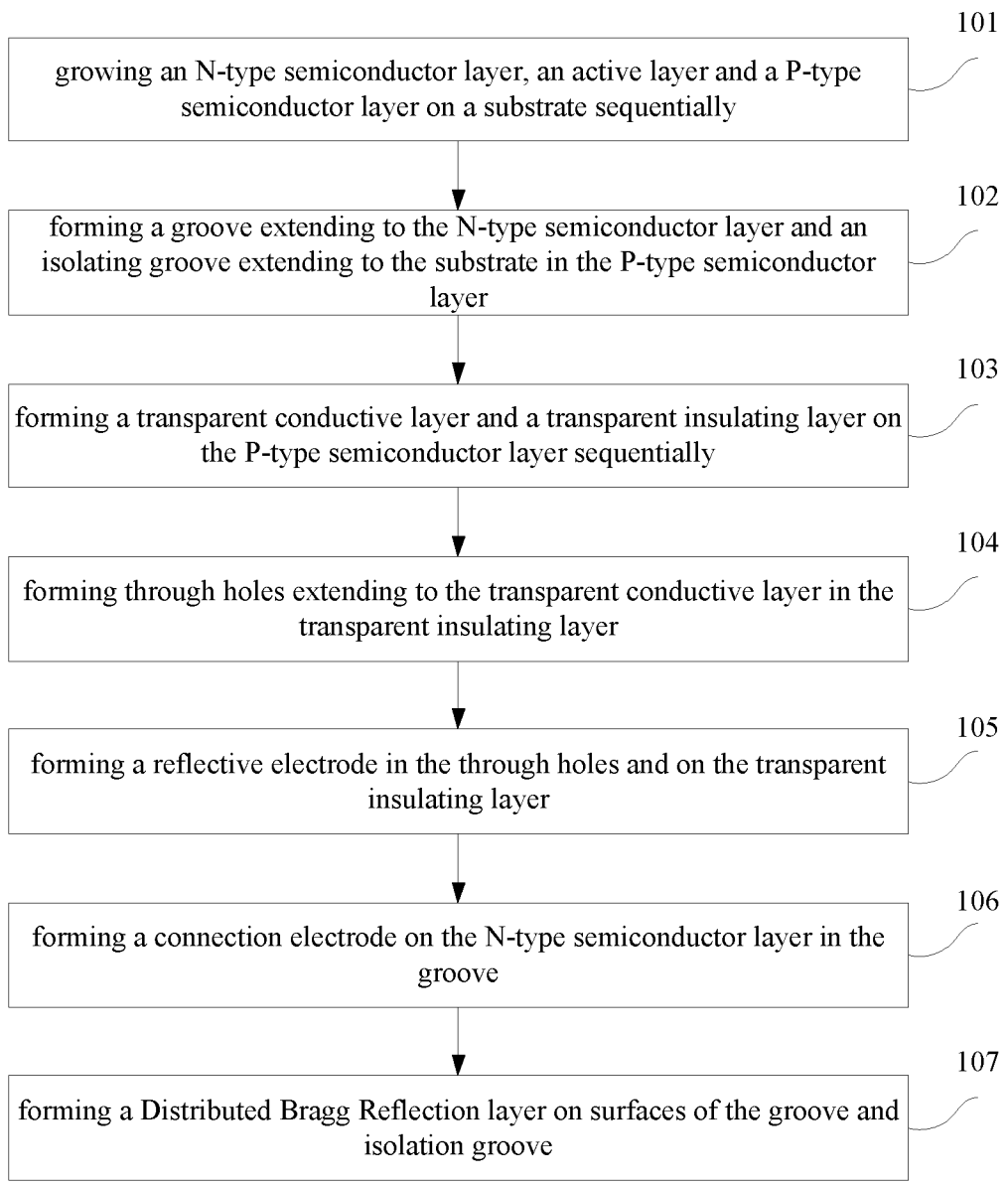
FIG. 6 is a flowchart of a manufacturing method for a flip light emitting diode chip according to an embodiment of the present disclosure.

An embodiment of the present disclosure provides a manufacturing method for a flip light emitting diode chip, which is applicable to the manufacture of the flip light emitting diode chip shown in FIG. 1. FIG. 6 is a flowchart of a manufacturing method for a flip light emitting diode chip according to an embodiment of the present disclosure. Referring to FIG. 6, the manufacturing method includes:

Step 101: growing an N-type semiconductor layer, an active layer and a P-type semiconductor layer on a substrate sequentially.

Optionally, the step 101 may include:

growing the N-type semiconductor layer, the active layer and the P-type semiconductor layer on the substrate sequentially by using a Metal-organic Chemical Vapor Deposition (MOCVD for short) technique.

Step 102: forming a groove extending to the N-type semiconductor layer and an isolating groove extending to the substrate in the P-type semiconductor layer.

Optionally, the step 102 may include:

forming a patterned photoresist on the P-type semiconductor layer by using a photolithography technique;

forming the groove extending to the N-type semiconductor layer in the P-type semiconductor layer by using an Inductively Coupled Plasma (ICP for short) etching technique;

forming another patterned photoresist on the P-type semiconductor layer and the N-type semiconductor layer in the groove by using the photolithography technique;

forming the isolating groove extending to the substrate in the N-type semiconductor layer in the groove by using the ICP technique; it should be noted that the groove in the P-type semiconductor layer has two parts, one part is used as the final groove extending to the N-type semiconductor layer, and the other part needs to continue to be etched to make it extend to the substrate so as to form the isolating groove;

removing the patterned photoresist.

In practical applications, the isolating groove has a greater depth, the formation of the isolating groove needs more time for etching, and produces relatively higher levels of heat. Optionally, a helium-cooled etching machine may be used as an opening device for the isolating groove, and to absorb the heat generated by the etching in time so as to avoid the performance of the flip LED chip being affected due to a temperature increase.

Step 103: forming a transparent conductive layer and a transparent insulating layer on the P-type semiconductor layer sequentially.

Optionally, the step 103 may include:

sputtering Indium Tin Oxide on the P-type semiconductor layer, and performing rapid thermal annealing (RTA for short) in an air atmosphere to form the transparent conductive layer;

forming the transparent insulating layer on the transparent conductive layer by a Plasma Enhanced Chemical Vapor Deposition (PECVD for short) technique.

Step 104: forming through holes extending to the transparent conductive layer in the transparent insulating layer.

In the embodiment of the present disclosure, the plurality of through holes include a plurality of rows of first through holes, and the first through holes in the same row have the same distance to the groove. In a direction away from the groove, the sum of the cross-sectional areas of the first through holes in each row gradually increases, and the cross section of the first through hole is the section of the first through hole perpendicular to the extending direction of the first through hole.

Optionally, the step 104 may include:

forming a patterned photoresist on the transparent insulating layer by using a photolithography technique;

forming the through holes extending to the transparent conductive layer in the transparent insulating layer by using a dry etching technique;

removing the patterned photoresist.

Step 105: forming a reflective electrode in the through holes and on the transparent insulating layer.

In the embodiments of the present disclosure, the reflective electrode is in contact with the transparent conductive layer within the through hole.

Optionally, the step 105 may include:

forming the reflective electrode in the through holes and on the transparent insulating layer by using a sputtering technique.

Step 106: forming a connection electrode on the N-type semiconductor layer in the groove.

Optionally, the step 106 may include:

forming the connection electrode on the N-type semiconductor layer in the groove by using the sputtering technique.

Step 107: forming a DBR layer on surfaces of the groove and isolation groove.

Optionally, the step 107 may include:

forming the DBR layer on the surfaces of the groove and isolation groove by using the PECVD technique.

Figure 7:
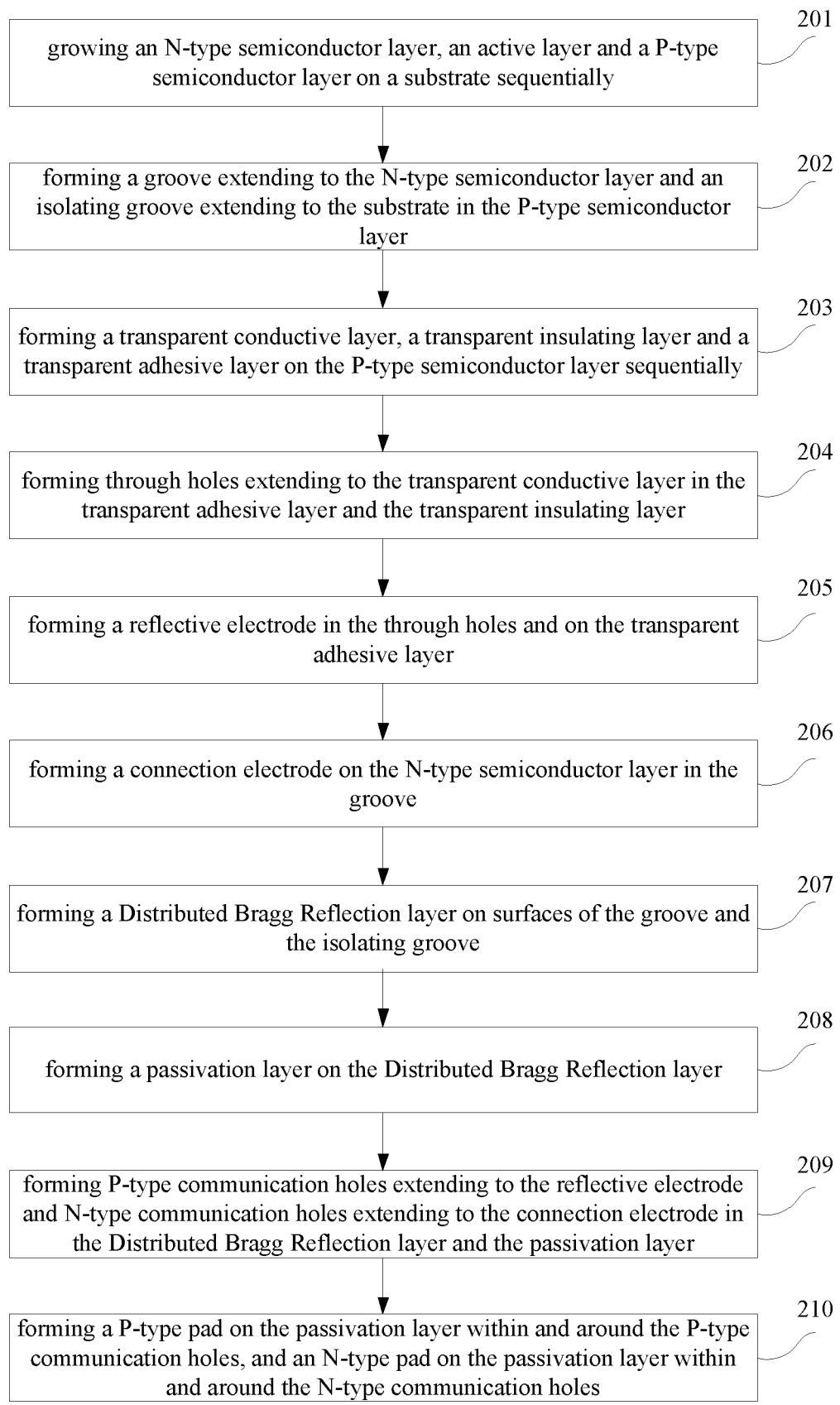
FIG. 7 is a flowchart of another manufacturing method for a flip light emitting diode chip according to an embodiment of the present disclosure.

An embodiment of the present disclosure provides a manufacturing method for a flip light emitting diode chip, which is applicable to the manufacture of the flip light emitting diode chip shown in FIG. 1. FIG. 7 is a flowchart of a manufacturing method for a flip light emitting diode chip according to an embodiment of the present disclosure. Referring to FIG. 7, the manufacturing method includes:

Step 201: growing an N-type semiconductor layer, an active layer and a P-type semiconductor layer on a substrate sequentially.

Optionally, the step 201 may be similar to the step 101, and will not be described in detail here again.

Step 202: forming a groove extending to the N-type semiconductor layer and an isolating groove extending to the substrate in the P-type semiconductor layer.

Optionally, the step 202 may be similar to the step 102, and will not be described in detail here again.

Step 203: forming a transparent conductive layer, a transparent insulating layer and a transparent adhesive layer on the P-type semiconductor layer sequentially.

Optionally, the step 203 may include:

sputtering Indium Tin Oxide on the P-type semiconductor layer, and performing RTA in an air atmosphere to form the transparent conductive layer;

forming the transparent insulating layer on the transparent conductive layer by using PECVD technique;

forming the transparent adhesive layer on the transparent insulating layer by using an evaporation technique.

In practical applications, the material of the transparent adhesive layer can be placed in a crucible, and then bombarded with an electron beam.

Step 204: forming through holes extending to the transparent conductive layer in the transparent adhesive layer and the transparent insulating layer.

In the embodiment of the present disclosure, the plurality of through holes include a plurality of rows of first through holes, and the first through holes in the same row has the same distance to the groove. In a direction away from the groove, the sum of the cross-sectional areas of the first through holes in each row gradually increases, and the cross-section of the first through hole is the section of the first through hole perpendicular to the extending direction of the first through hole.

Optionally, the step 204 may be similar to the step 104, and will not be described in detail here again.

Step 205: forming a reflective electrode in the through holes and on the transparent adhesive layer.

In the embodiments of the present disclosure, the reflective electrode is in contact with the transparent conductive layer within the through holes.

Optionally, the step 205 can be similar to the step 105, and will not be described in detail here again.

Step 206: forming a connection electrode on the N-type semiconductor layer in the groove.

Optionally, the step 206 may be similar to the step 106, and will not be described in detail here again.

Step 207: forming a DBR layer on surfaces of the groove and the isolating groove.

Optionally, the step 207 may be similar to the step 107, and will not be described in detail here again.

Step 208: forming a passivation layer on the DBR layer.

Optionally, the step 208 may include:

forming the passivation layer on the DBR layer by using a PECVD technique.

Step 209: forming P-type communication holes extending to the reflective electrode and N-type communication holes extending to the connection electrode in the DBR layer and the passivation layer.

Optionally, the step 209 may include:
forming a patterned photoresist on the passivation layer by using the photolithography technique;
forming the P-type communication holes extending to the reflective electrode and the N-type communication holes extending to the connection electrode in the DBR layer and the passivation layer by using the dry etching technique;
removing the patterned photoresist.

Step 210: forming a P-type pad on the passivation layer within and around the P-type communication holes, and an N-type pad on the passivation layer within and around the N-type communication holes.

In the embodiment of the present disclosure, the P-type pad is in contact with the reflective electrode within the through holes, and the N-type pad is in contact with the connection electrode within the through holes.

Optionally, this step 210 may include:
forming the P-type pad on the passivation layer within and around the P-type communication holes, and the N-type pad on the passivation layer within and around the N-type communication holes by using the sputtering technique.

In the embodiment of the present disclosure, steps 208 to 210 are optional steps.

The above are only optional embodiments of the present disclosure, and are not intended to limit the present disclosure. Any modification, equivalent replacement, improvements, etc. made within the spirit and principle of the present disclosure may fall within the protection scope of the present disclosure.

What is claimed is:

1. A flip light emitting diode chip, comprising:
a substrate, an N-type semiconductor layer, an active layer, a P-type semiconductor layer, a transparent conductive layer, a transparent insulating layer, a reflective electrode, a connection electrode, and a Distributed Bragg Reflection layer, wherein:
the N-type semiconductor layer, the active layer and the P-type semiconductor layer are sequentially-stacked on the substrate, and the P-type semiconductor layer is provided with a trench extending to the N-type semiconductor layer, the trench comprising two opposite sides having extended lengths;
the N-type semiconductor layer, the active layer and the P-type semiconductor layer are provided with an isolating groove extending to the substrate;
the transparent conductive layer and the transparent insulating layer are sequentially-stacked on the P-type semiconductor layer, and the transparent insulating layer is provided with a plurality of through holes extending to the transparent conductive layer;
the reflective electrode is provided on the transparent insulating layer and in contact with the transparent conductive layer via the plurality of through holes;
the connection electrode is provided on the N-type semiconductor layer in the trench;
the Distributed Bragg Reflection layer is laid on surfaces of the trench and the isolating groove;
the plurality of through holes comprise a plurality of rows of first through holes distributed between one of the opposite sides of the trench and a corresponding edge of the flip light emitting diode chip, and a subset of first through holes in the same row have the same distance to the trench; and
in a direction away from the trench, a sum of cross-sectional areas of the subset of first through holes in each of the plurality of rows gradually increases with a distance of the respective row from the trench, and a cross section of each first through hole is the section of the respective first through hole perpendicular to an extending direction of the respective first through hole.

2. The flip light emitting diode chip according to claim 1, wherein in two adjacent rows of the first through holes, the sum of the cross-sectional areas of the first through holes in a first row away from the trench is 120%-140% of the sum of the cross-sectional areas of the first through holes in a second row close to the trench.

3. The flip light emitting diode chip according to claim 1, wherein the first through holes in the same row are equal in area, and the plurality of rows of first through holes satisfy at least one of a plurality of conditions including:
in a direction away from the trench, a cross-sectional area of each first through hole gradually increases; and
in a direction away from the trench, a number of the first through holes in each row gradually increases.

4. The flip light emitting diode chip according to claim 1, wherein a distance between any two adjacent rows of the first through holes is substantially constant.

5. The flip light emitting diode chip according to claim 1, wherein a distance between two adjacent first through holes in the same row is substantially constant.

6. The flip light emitting diode chip according to claim 1, wherein the first through hole is polygonal.

7. The flip light emitting diode chip according to claim 1, wherein the transparent insulating layer has a cross section shaped as a polygon, and the cross section of the transparent insulating layer is the section of the transparent insulating layer perpendicular to the extending direction of each through hole, and wherein the plurality of through holes further comprise a plurality of second through holes that are located at different corners of the polygon.

8. The flip light emitting diode chip according to claim 7, wherein the plurality of second through holes has a cross section shaped as a sectored ring.

9. The flip light emitting diode chip according to claim 8, wherein a center of the sectored ring and a corner of the polygon corresponding to the plurality of second through holes are provided on two sides of the sectored ring, a cross section of each second through hole is a section of the respective second through hole perpendicular to an extending direction of the respective second through hole.

10. The flip light emitting diode chip according to claim 8, wherein the sectored ring has a width of 5 microns, and an outer ring diameter of 25 microns.

11. The flip light emitting diode chip according to claim 1, wherein the flip light emitting diode chip further comprises a transparent adhesive layer, and the transparent adhesive layer is sandwiched between the transparent insulating layer and the reflective electrode.

12. The flip light emitting diode chip according to claim 11, wherein a material of the transparent adhesive layer is aluminum oxide.

13. The flip light emitting diode chip according to claim 11, wherein the transparent adhesive layer has a thickness of less than 100 angstroms.

14. The flip light emitting diode chip according to claim 1, wherein the reflective electrode comprises a reflective layer and a blocking layer stacked sequentially, and the blocking layer comprises nickel layers and platinum layers stacked alternately.

15. The flip light emitting diode chip according to claim 14, wherein the reflective layer is a silver layer.

16. A manufacturing method for a flip light emitting diode chip, comprising:
   growing an N-type semiconductor layer, an active layer and a P-type semiconductor layer sequentially on a substrate;
   forming a trench extending to the N-type semiconductor layer and an isolating groove extending to the substrate in the P-type semiconductor layer, the trench comprising two opposite sides having extended lengths;
   forming a transparent conductive layer and a transparent insulating layer sequentially on the P-type semiconductor layer;
   forming through holes extending to the transparent conductive layer in the transparent insulating layer, wherein a plurality of through holes comprises a plurality of rows of first through holes distributed between one of the opposite sides of the trench and a corresponding edge of the flip light emitting diode chip, and a subset of the first through holes in the same row have the same distance to the trench; in a direction away from the trench, a sum of cross-sectional areas of the first through holes in each of the plurality of rows gradually increases with a distance of the respective row from the trench, and a cross section of the first through hole is the section of the first through hole perpendicular to an extending direction of the first through hole;
   forming a reflective electrode on the transparent insulating layer, and the reflective electrode being in contact with the transparent conductive layer via the plurality of through holes;
   forming a connection electrode on the N-type semiconductor layer in the trench; and
   forming a Distributed Bragg Reflection layer on surfaces of the trench and the isolating groove.

17. The manufacturing method according to claim 16, wherein the manufacturing method further comprises:
   forming a transparent adhesive layer on the transparent insulating layer before forming the plurality of through holes extending to the transparent conductive layer in the transparent insulating layer.

18. The manufacturing method according to claim 17, wherein a material of the transparent adhesive layer is aluminum oxide.

19. The manufacturing method according to claim 16, wherein in two adjacent rows of the first through holes, the sum of the cross-sectional areas of the first through holes in a first row away from the trench is 120%-140% of the sum of the cross-sectional areas of the first through holes in a second row close to the trench.

20. The manufacturing method according to claim 16, wherein the first through holes-in the same row are equal in area, and the plurality of rows of first through holes satisfy at least one of a plurality of conditions including:
   in a direction away from the trench, a cross-sectional area of each first through hole-gradually increases; and
   in a direction away from the trench, a number of the first through holes in each row gradually increases.

* * * * *